(12) United States Patent
Huang et al.

(10) Patent No.: US 10,211,103 B1
(45) Date of Patent: Feb. 19, 2019

(54) ADVANCED STRUCTURE FOR SELF-ALIGNED CONTACT AND METHOD FOR PRODUCING THE SAME

(71) Applicant: GLOBALFOUNDRIES Inc., Grand Cayman (KY)

(72) Inventors: Haigou Huang, Rexford, NY (US); Dinesh Koli, Mechanicville, NY (US); Yuan Zhou, Rexford, NY (US); Xingzhao Shi, Ballston Lake, NY (US); Chih-Chiang Chang, Clifton Park, NY (US); Tai Fong Chao, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/787,257

(22) Filed: Oct. 18, 2017

(51) Int. Cl.
| | |
|---|---|
| H01L 21/28 | (2006.01) |
| H01L 21/768 | (2006.01) |
| H01L 29/66 | (2006.01) |
| H01L 23/522 | (2006.01) |
| H01L 23/532 | (2006.01) |

(52) U.S. Cl.
CPC .. *H01L 21/76897* (2013.01); *H01L 21/28247* (2013.01); *H01L 23/5226* (2013.01); *H01L 23/53295* (2013.01); *H01L 29/6656* (2013.01)

(58) Field of Classification Search
CPC .... H01L 29/7855–29/7856; H01L 2029/7858; H01L 29/4179; H01L 21/28008–21/28291; H01L 21/823437–21/823456; H01L 21/76897; H01L 21/823828–21/82385; H01L 27/11585–27/11597; H01L 29/42312–29/42392; H01L 29/49–29/4991; H01L 29/66515; H01L 29/66545; H01L 29/66787–29/66818; H01L 29/78391; H01L 29/41725–29/41791; H01L 29/7839; H01L 29/806; H01L 29/6656
See application file for complete search history.

(56) References Cited

U.S. PATENT DOCUMENTS

| | | |
|---|---|---|
| 6,855,610 B2 | 2/2005 | Tung et al. |
| 6,884,715 B1 | 4/2005 | Kwon et al. |
| 2017/0040318 A1* | 2/2017 | Hung ................ H01L 27/0886 |

* cited by examiner

*Primary Examiner* — Tucker J Wright
(74) *Attorney, Agent, or Firm* — Ditthavong & Steiner, P.C.

(57) ABSTRACT

Methods of forming a SAC cap with SiN U-shaped and oxide T-shaped structures and the resulting devices are provided. Embodiments include forming a substrate with a trench and a plurality of gate structures; forming a nitride liner over portions of the substrate and along sidewalls of each gate structure; forming an ILD between each gate structure and in the trench; recessing each gate structure between the ILD; forming a U-shaped nitride liner over each recessed gate structure; forming an a-Si layer over the nitride liner and the U-shaped nitride liner; removing portions of the nitride liner, the U-shaped nitride liner and the a-Si layer; forming a W layer over portions of the substrate adjacent to and between the a-Si layer; forming an oxide liner over the nitride liner, the U-shaped nitride liner and along sidewalls of the W layer; and forming an oxide layer over portions of the oxide liner.

7 Claims, 12 Drawing Sheets

ADVANCED STRUCTURE FOR SELF-ALIGNED CONTACT AND METHOD FOR PRODUCING THE SAME

TECHNICAL FIELD

The present disclosure relates to the manufacture of semiconductor devices, such as integrated circuits (ICs). The present disclosure is particularly applicable to processes for forming self-aligned contact (SAC) in ICs, particularly for the 7 nanometer (nm) technology node and beyond.

BACKGROUND

In the fabrication of semiconductor devices, many fin type field effect transistors (finFETs) rely on tall gate structures. Such structures may allow for a reduction in horizontal resistance, however, tall gate structures typically result in gate (PC) collapse, hugging gates, active (Rx) hole and gate cut (CT) tip to tip short. Consequently a SAC process can help avoid such problems. Furthermore, tall gate structures result in higher gate height budget due to trench silicide (TS) reactive-ion etching (RIE) selectivity and TS chemical-mechanical planarization (CMP), e.g., TS RIE and TS CMP can cause more than 35 nm of gate height loss.

A known approach for forming a conventional SAC cap layer includes forming a silicon nitride (SiN) layer over recessed gate structures, as depicted in FIG. 1. Referring to FIG. 1 (a cross-sectional view), a nitride layer 101 is formed, e.g., of SiN, as a protection layer over the recessed gates 103 and the spacers 105. However, the nitride layer 101 is incapable of preventing erosion of the gates 103 and spacers 105 during TS and contact etch stop layer (CESL) RIE for one or more of the reasons described above.

A need therefore exists for methodology for forming a bilayer SAC cap to prevent cap material and spacer erosion during subsequent TS and CELS RIE.

SUMMARY

An aspect of the present disclosure is a method of forming a bilayer SAC cap with interlocking SiN U-shaped and oxide T-shaped structures.

Another aspect of the present disclosure is a device including a bilayer SAC caps with interlocking SiN U-shaped and oxide T-shaped structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a substrate with a trench and a plurality of gate structures laterally separated; forming a nitride liner over portions of the substrate and along sidewalls of each gate structure; forming an inter-layer dielectric (ILD) between each gate structure and in the trench, an upper surface of the ILD in the trench being coplanar with an upper surface of the gates structures; recessing each gate structure between the ILD; forming a U-shaped nitride liner over each recessed gate structure; forming an amorphous silicon (a-Si) layer over the nitride liner and the U-shaped nitride liner; removing portions of the nitride liner, the U-shaped nitride liner and the a-Si layer; forming a tungsten (W) layer over portions of the substrate adjacent to and between the a-Si layer; forming an oxide liner over the nitride liner, the U-shaped nitride liner and along sidewalls of the W layer and the ILD; and forming an oxide layer over portions of the oxide liner.

Aspects of the present disclosure include forming the substrate by: forming a silicon (Si) layer; forming the trench through a portion of the Si layer, a first region and a second region formed on opposite sides of the trench; and forming source/drain (S/D) regions laterally separated in the first region and S/D regions laterally separated in the second region. Further aspects include the first region and the second region including a negative region and a positive region, respectively. Another aspect includes forming the plurality of gate structures by: forming a gate between each of the S/D regions in the first region and the S/D regions in the second region; forming a gate adjacent to a S/D region and along a portion of a sidewall of the trench in each of the first region and the second region; and forming a spacer along each sidewall of each gate. Additional aspects include planarizing the ILD, the nitride liner, the gates, and the spacers prior to recessing each gate structure. Another aspect includes the nitride liner formed in the trench including a curved surface. Further aspects include forming the U-shaped nitride liner by: forming a second nitride liner over the substrate and along sidewalls of the first nitride liner; forming a spin-on hard-mask (SOH) layer over the substrate; planarizing the SOH layer down to the second nitride liner; recessing the SOH layer; stripping the nitride liner and the second nitride liner down to the SOH layer; and removing the SOH layer. Additional aspects include forming the a-Si layer by: forming the a-Si layer over the substrate; and planarizing the a-Si layer down to the ILD. Further aspects include removing the portions of the nitride liner, the U-shaped nitride liner and the a-Si layer by: forming a hard mask over portions of the substrate and the ILD in the trench; removing exposed portions of the ILD and the nitride layer down to the substrate; removing a first portion and a second portion of the a-Si layer down to the U-shaped nitride liner, the first portion and the second portion being adjacent to and on opposite sides of the ILD in the trench; removing the hard mask prior to forming the W layer; and removing the a-Si layer subsequent to forming the W layer. Additional aspects include forming the W layer by: forming the W layer over the substrate; and planarizing the W layer down to the a-Si layer.

Another aspect of the present disclosure is a device including: a first pair of gates and a second pair of gates over a substrate with a shallow trench isolation (STI) structure between a first region and a second region of the substrate; a first nitride liner along and above sidewalls of the first pair of gate structures and sidewalls of the second pair of gates adjacent to the STI structure and along opposite sidewalls of the second pair of gates; a U-shaped nitride liner over each of the first pair of gate structures; a second nitride liner along the first nitride liner above sidewalls of the second pair of gates; a bilayer SAC cap over the U-shaped nitride liner and the first nitride liner along and above sidewalls of each of the first pair of gates; an oxide structure over the first nitride liner and the second nitride liner adjacent to the STI structure; and W over portions of the substrate and each of the second pair of gates, wherein an upper surface of each of the W, the bilayer SAC caps, the oxide structures, and the STI structure is coplanar.

Aspects of the device include each gate of the first pair and the second pair including: a metal gate; and a low-K spacer along each sidewall of the metal gate. Another aspect includes the substrate including: a Si layer with a first region and a second region each on opposite sides of the STI structure; and S/D regions laterally separated in the first region and S/D regions laterally separated in the second region. Other aspects include the first pair of gates are formed between the S/D regions in the first region and the S/D regions in the second region, respectively, and the second pair of gates are formed adjacent to a S/D region in the first region, along a portion of a sidewall of the substrate in the first region and adjacent to the STI structure and adjacent to a S/D region in the second region, along a portion of a sidewall of the substrate in the second region and adjacent to the STI structure, respectively. A further aspect includes the first region and the second region includes a negative region and a positive region, respectively. Additional aspects include the S/D regions in the first region and the S/D regions in the second region include silicon germanium (SiGe) or any epitaxial (EPI) material and a silicon-phosphorus (SiP) or any EPI material layer, respectively. A further aspect includes the bilayer SAC cap including: a U-shaped oxide liner over the first nitride liner and the U-shaped nitride liner; and an oxide layer within the U-shaped oxide liner, wherein an upper surface of the U-shaped oxide liner and an upper surface of the oxide layer are coplanar.

A further aspect of the present disclosure is a method including: forming a substrate with a trench and a plurality of gate structures laterally separated; forming a nitride liner to a thickness of 4 nm to 5 nm over portions of the substrate and along sidewalls of each gate structure; forming an ILD between each gate structure and in the trench, an upper surface of the ILD in the trench being coplanar with an upper surface of the gates structures; recessing each gate structure between the ILD; forming a U-shaped nitride liner to a thickness of 2 nm to 8 nm over each recessed gate structure by atomic layer deposition (ALD); forming an a-Si layer over the nitride liner and the U-shaped nitride liner; removing portions of the nitride liner, the U-shaped nitride liner and the a-Si layer by RIE; forming a W layer over portions of the substrate adjacent to and between the a-Si layer; forming an oxide liner to a thickness of 4 nm to 5 nm over the nitride liner, the U-shaped nitride liner and along sidewalls of the W layer and the ILD; and forming an oxide layer to a thickness of 15 nm to 25 nm over portions of the oxide liner.

Aspects of the present disclosure include forming the U-shaped nitride liner by: forming a second nitride liner over the substrate and along sidewalls of the first nitride liner; forming a SOH layer over the substrate; planarizing the SOH layer down to the second nitride liner; recessing the SOH layer by RIE; stripping the nitride liner and the second nitride liner down to the SOH layer by a wet etch or a dry etch; and removing the SOH layer. Another aspect includes removing the portions of the nitride liner, the U-shaped nitride liner and the a-Si layer by: forming a hard mask over portions of the substrate and the ILD in the trench; removing exposed portions of the ILD and the nitride layer down to the substrate by RIE; removing a first portion and a second portion of the a-Si layer down to the U-shaped nitride liner by RIE, the first portion and the second portion being adjacent to and on opposite sides of the ILD in the trench; removing the hard mask prior to forming the W layer; and removing the a-Si layer subsequent to forming the W layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of cap material and spacer erosion, step height leading to low with-in die (WID) uniformity and possible TS to PC shorts, and high gate height budget requirements attendant upon forming semiconductor devices in the 7 nm technology node and beyond. The problem is solved, inter alia, by forming a bilayer SAC cap with interlocking SiN U-shaped and oxide T-shaped structures.

Methodology in accordance with embodiments of the present disclosure includes forming a substrate with a trench and a plurality of gate structures laterally separated. A nitride liner is formed over portions of the substrate and along sidewalls of each gate structure. An ILD is formed between each gate structure and in the trench, an upper surface of the ILD in the trench being coplanar with an upper surface of the gates structures. The gate structures between the ILD are recessed, and a U-shaped nitride liner is formed over the recessed gate structures. An a-Si layer is formed over the nitride liner and the U-shaped nitride liner. Portions of the nitride liner, the U-shaped nitride liner and the a-Si layer are removed. A W layer is formed over portions of the substrate adjacent to and between the a-Si layer. An oxide liner is formed over the nitride liner, the U-shaped nitride liner and along sidewalls of the W layer and the ILD, and an oxide layer is formed over portions of the oxide liner.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
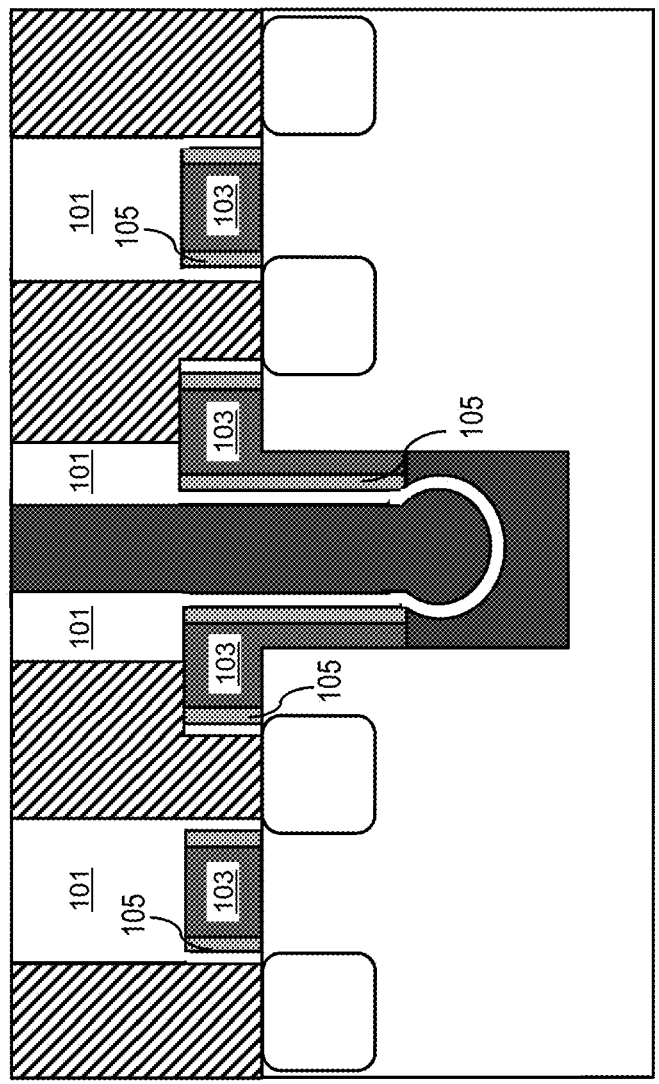
FIG. 1 is a cross-sectional view of a device with a conventional SiN SAC cap layer.
Figure 2:
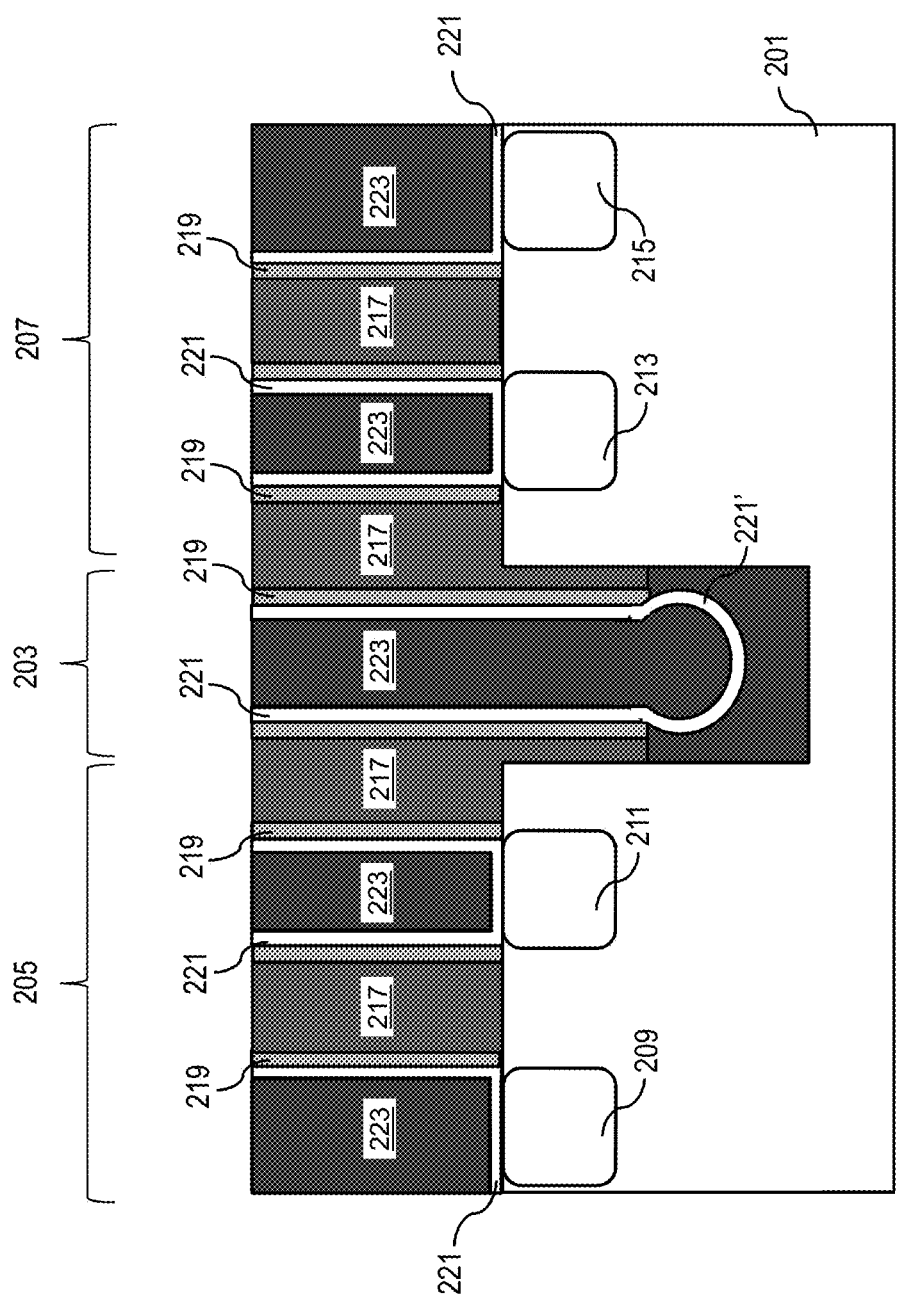
FIGS. 2 through 12 schematically illustrate cross-sectional views of a process flow for forming a bilayer SAC cap with interlocking SiN U-shaped and oxide T-shaped structures, in accordance with an exemplary embodiment.

FIGS. 2 through 12 schematically illustrate cross-sectional views of a process flow for forming a bilayer SAC cap with interlocking SiN U-shaped and oxide T-shaped structures, in accordance with an exemplary embodiment. Referring to FIG. 2, a substrate 201 is formed, e.g., of a Si. Then, a trench 203 is formed through a portion of the substrate 201, forming region 205 and region 207 on the opposite sides of the trench 203. In this instance, region 205 is negative and region 207 is positive. Subsequently, laterally separated S/D regions 209 and 211 are formed, e.g., of a SiGe or any EPI material, in region 205 and laterally separated S/D regions 213 and 215 are formed, e.g., of SiP or any EPI material, in region 207. Next, a plurality of gates 217 are formed, e.g., of W, between the S/D regions 209 and 211, the S/D regions 213 and 215, and adjacent to the S/D regions 211 and 213 and along portions of the trench 203 sidewalls, respectively. Subsequently, a spacer 219 is formed, e.g., of low-K, over portions of the substrate 201 and on the sidewalls of each of the gate 217.

A nitride liner 221 is then formed, e.g., to a thickness of 4 nm to 5 nm, over portions of the substrate 201 and along the sidewalls of each spacer 219, a curved shaped portion of the nitride liner 221 is formed in the trench 203 during the process. Next, an ILD 223 is formed over the nitride liner 221 and in the trench 203 and the ILD 223, the nitride liner 221, the spacers 219 and the gates 217 are planarized by CMP.

Figure 3:
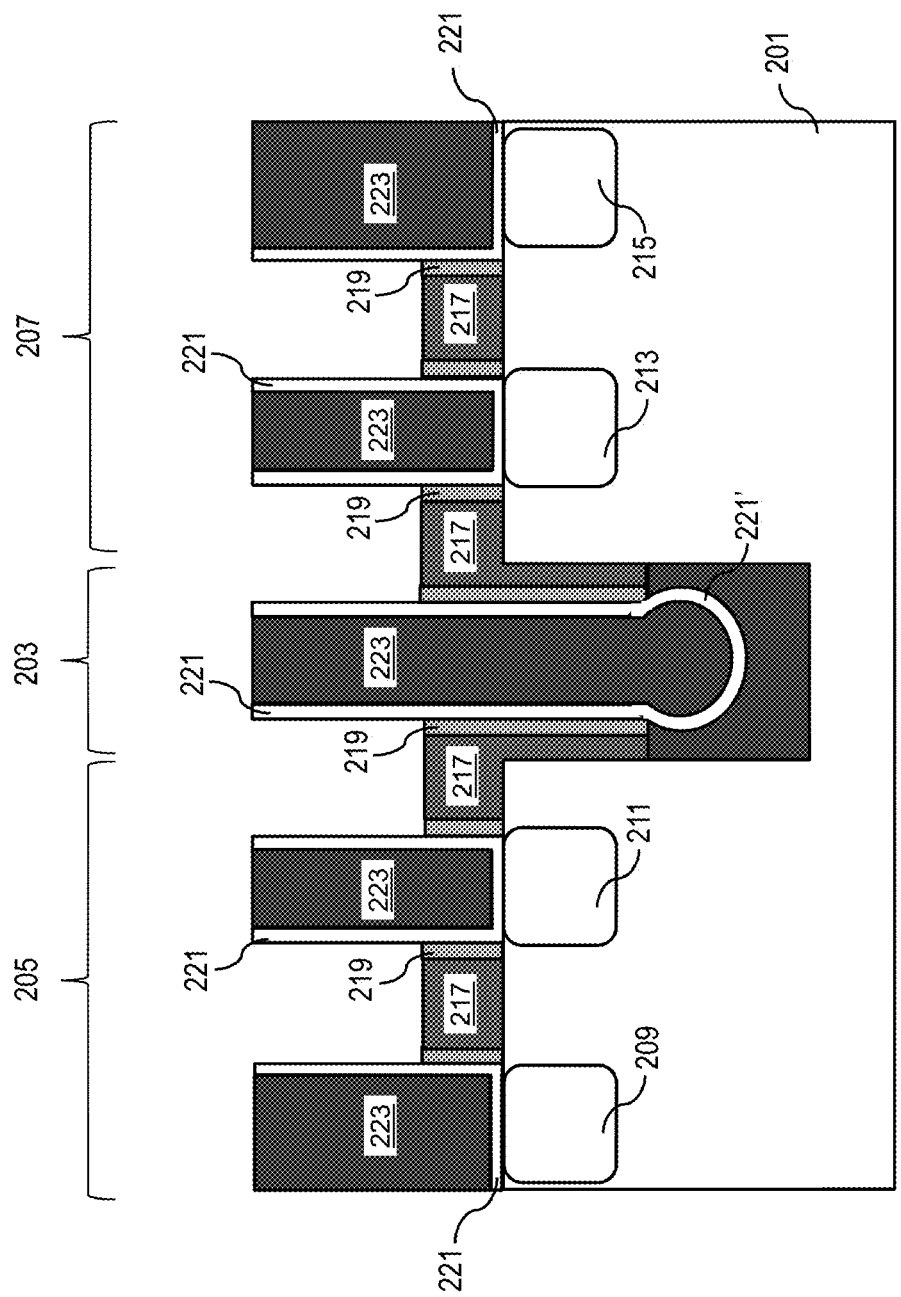
Figure 4:
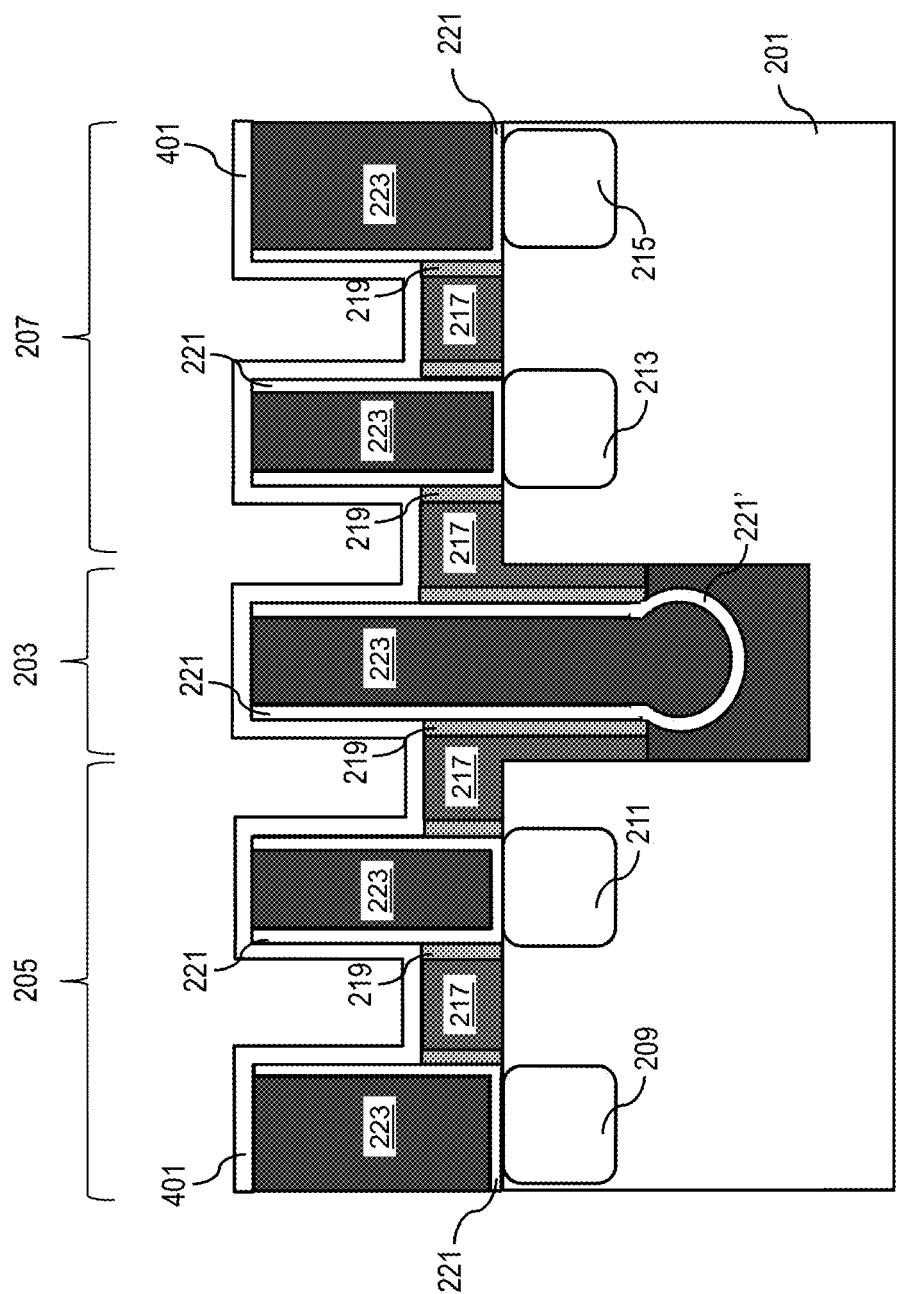
Figure 5:
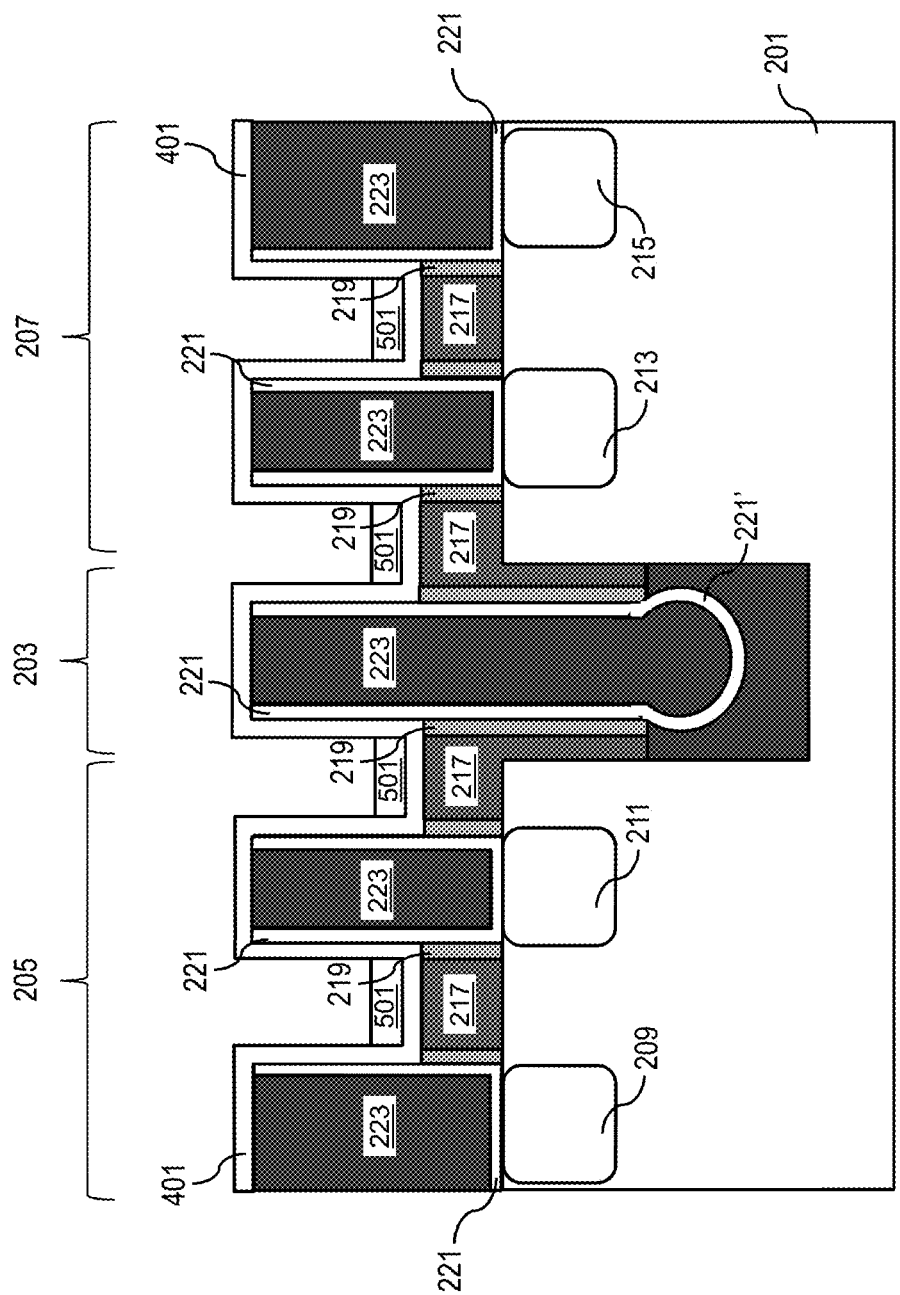
Figure 6:
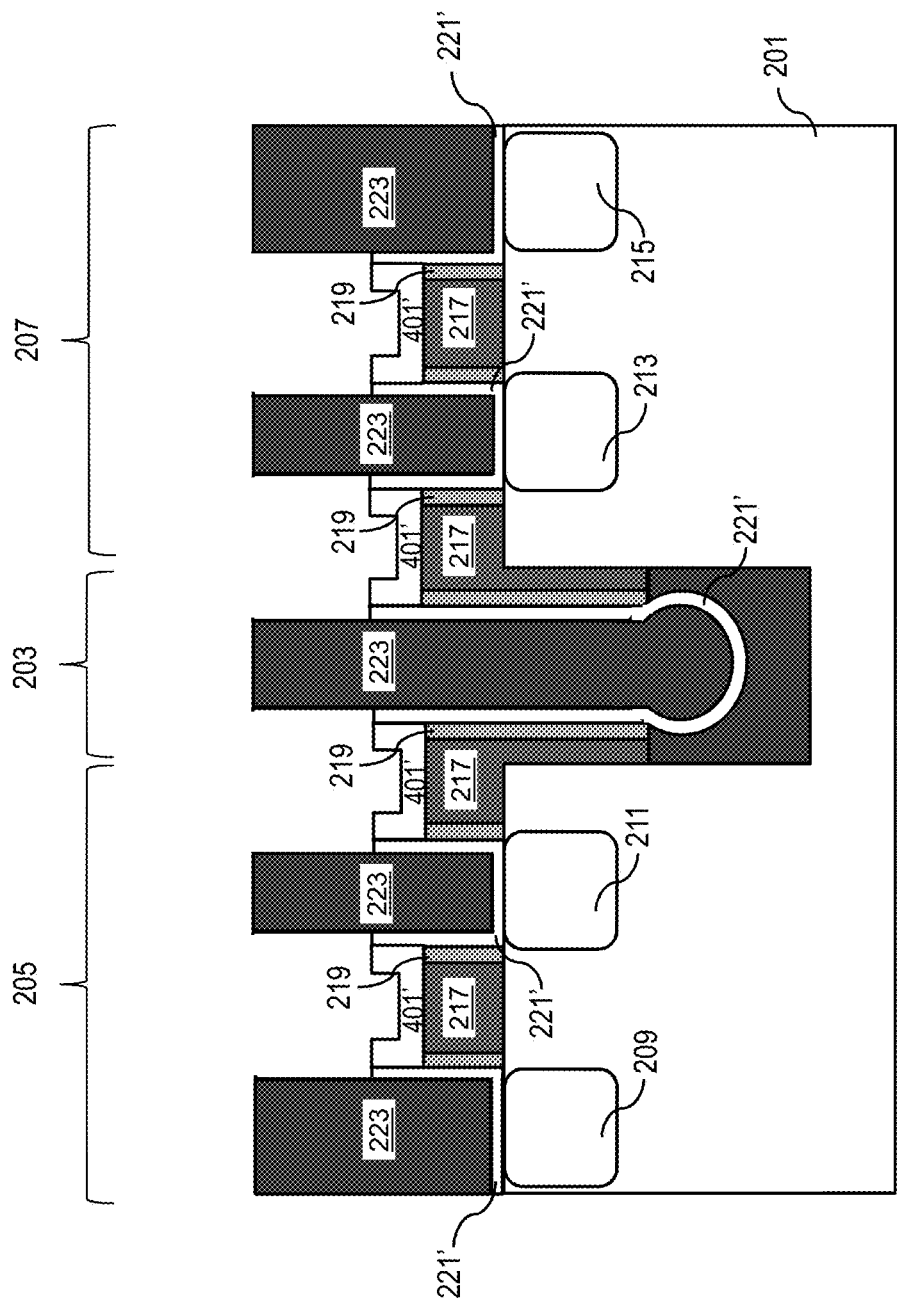

As illustrated in FIG. 3, the gates 217 and spacers 219 are recessed between the nitride liner 221. Referring to FIG. 4, a nitride liner 401 is formed, e.g., by ALD, over the ILD 223, the nitride liner 221, the spacer 219 and the gates 217 to a thickness, e.g., of 2 nm to 8 nm. Next, a SOH layer (not shown for illustrative convenience) is formed over the nitride liner 401. The SOH layer is planarized down to the nitride liner 401 and then recessed by RIE, forming the SOH layer 501, as illustrated in FIG. 5. Portions of the nitride liner 221 and 401 are then stripped, e.g., by a wet etch or a dry etch, down to the SOH layer 501 and the SOH layer 501 is removed, forming a U-shaped nitride liner 401', as depicted in FIG. 6.

Figure 7:
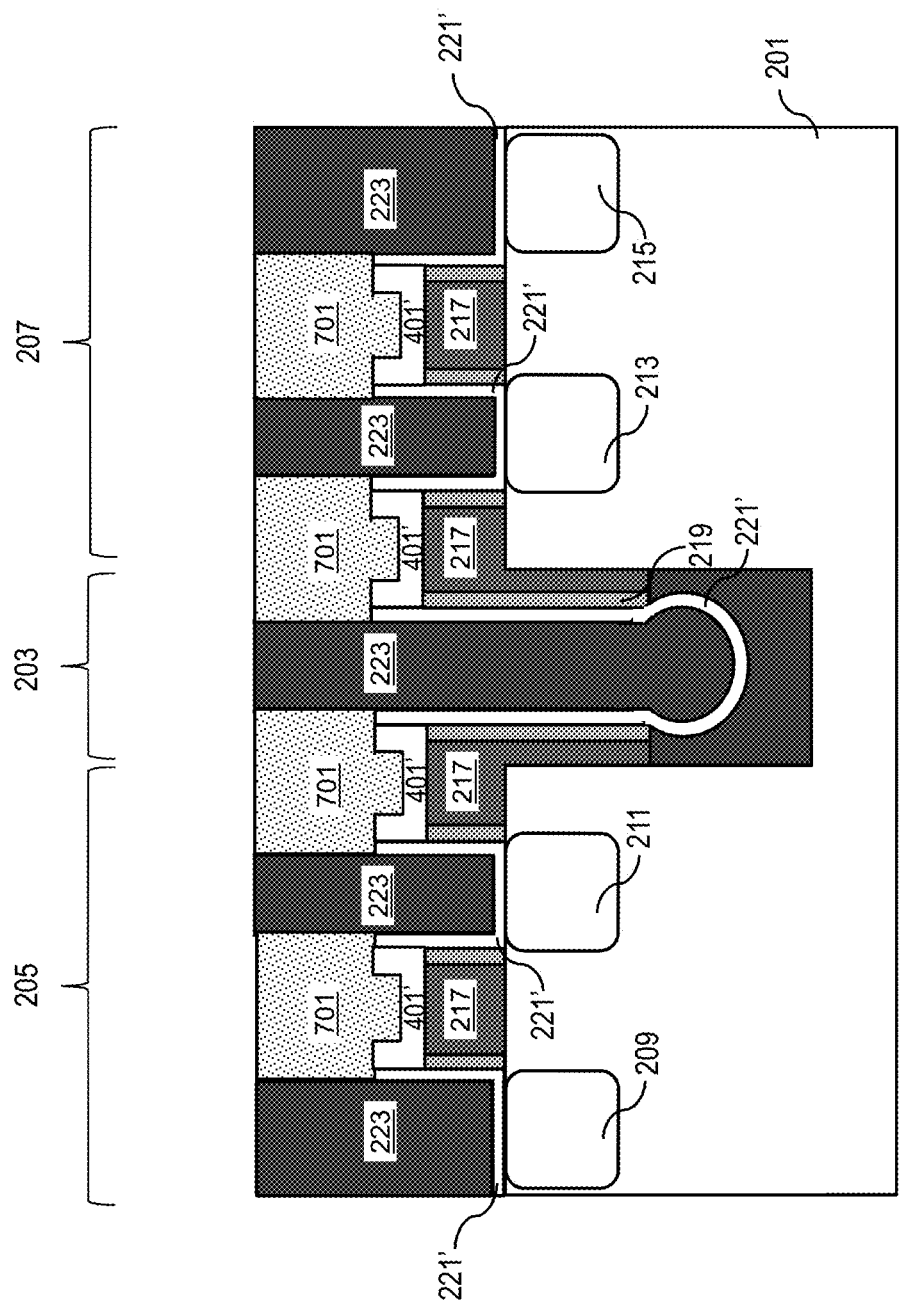
Figure 8:
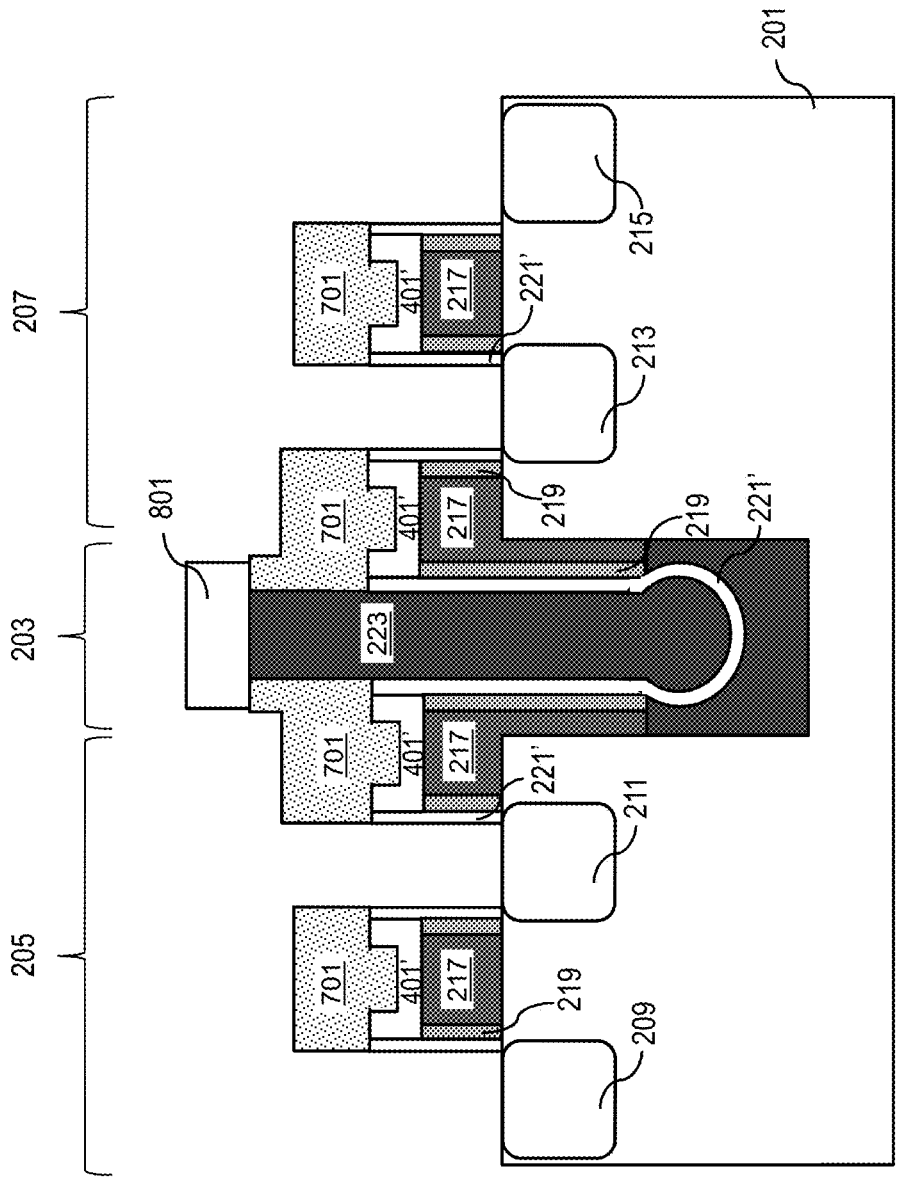
Figure 9:
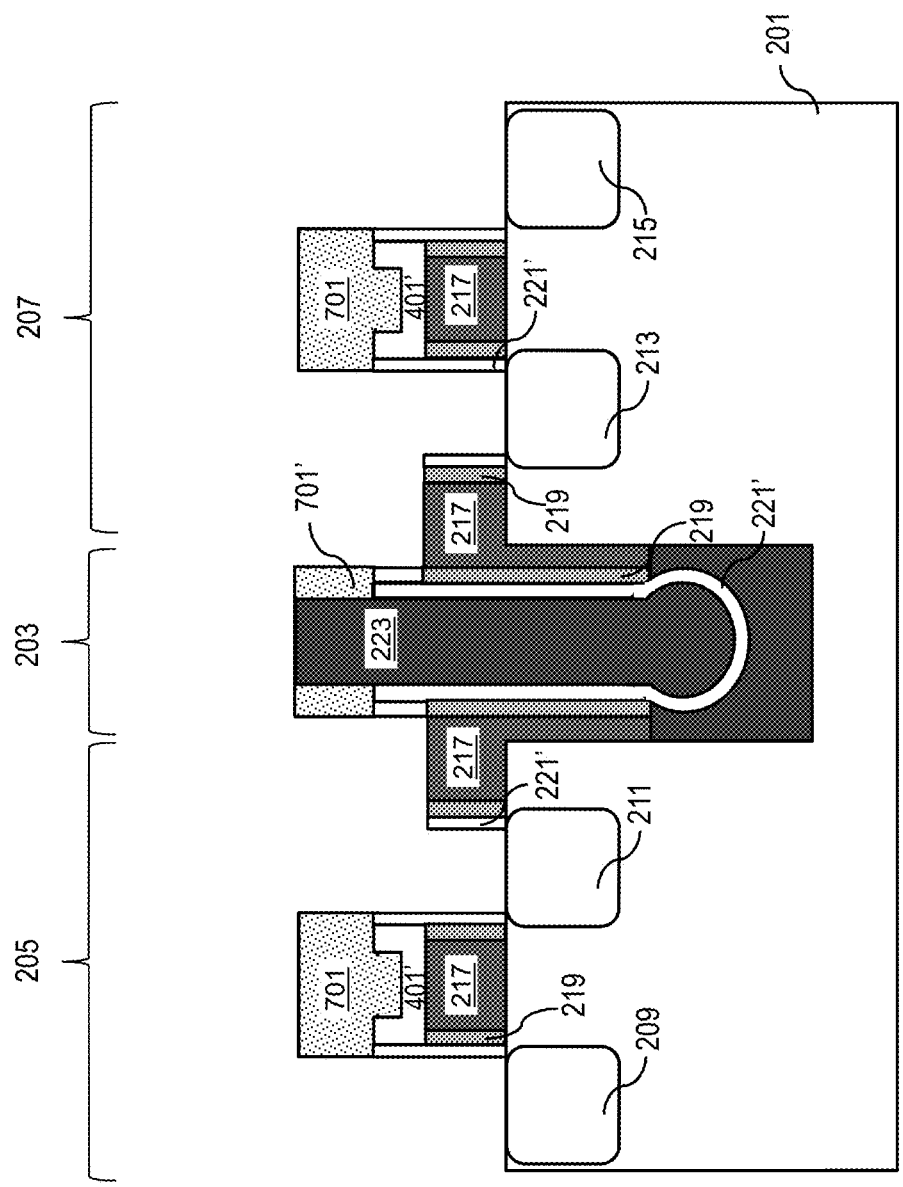

Referring to FIG. 7, an a-Si layer (not shown for illustrative convenience) is formed over the nitride liner 221' and the U-shaped nitride liner 401' and then planarized down to the ILD 223 by CMP, forming the T-shaped a-Si layer 701. Subsequent to the formation of the a-Si layer 701, a hard mask 801 is formed over portions of the of the device including over the ILD 223 in the trench and portions of the a-Si layer 701, as illustrated in FIG. 8. Next, the unprotected portions of the ILD 223 and nitride layer 221' are removed down to the substrate 201 by RIE. Referring to FIG. 9, portions of the a-Si layer 701 adjacent to and on the opposite sides of the hard mask 801 are subsequently removed, e.g., by RIE, forming a-Si layer 701'. At or about the same time, portions of the U-shaped nitride liner 401' and the nitride layer 221' are also removed, e.g., by RIE, down to the gates 217. Thereafter, the hard mask 801 is removed.

Figure 10:
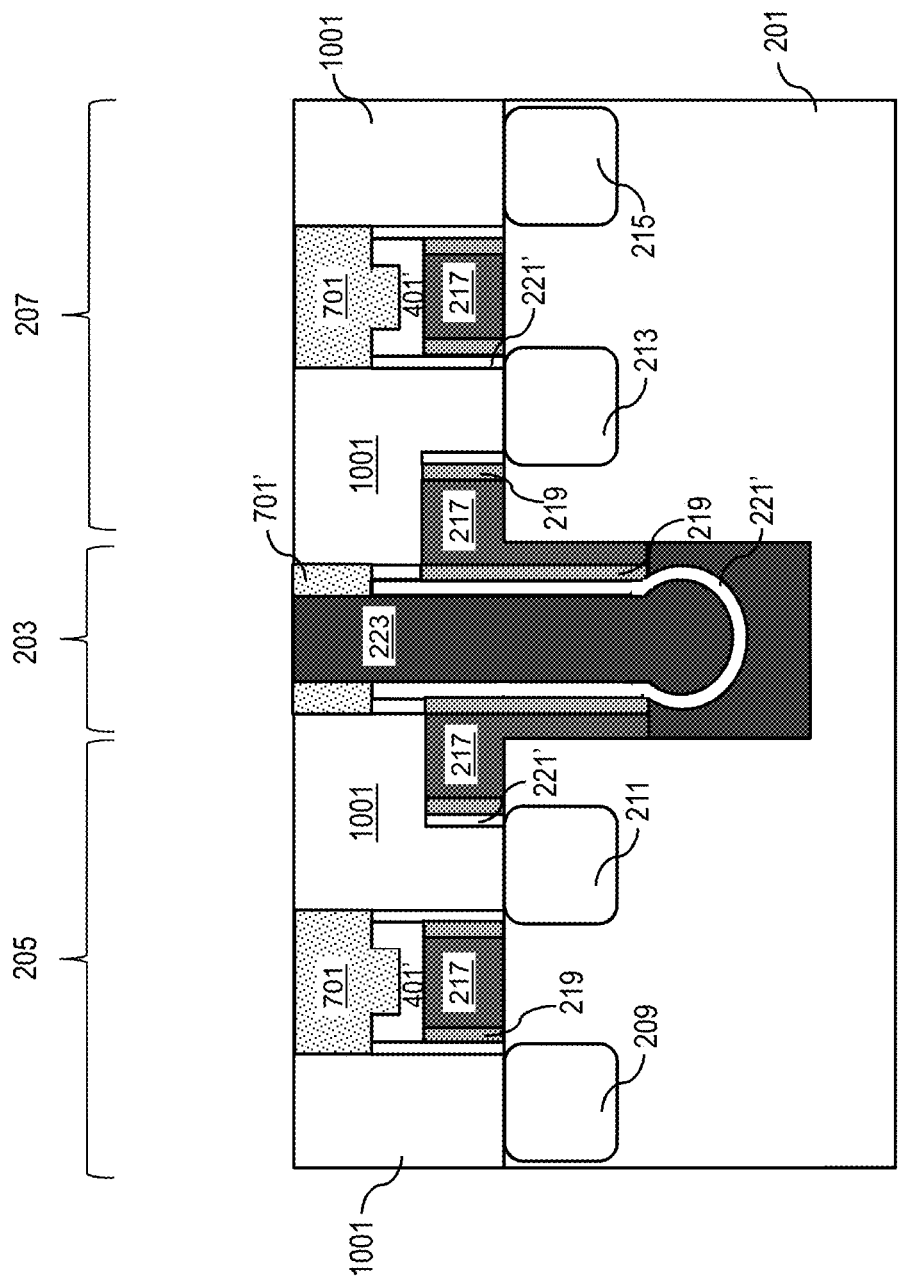
Figure 11:
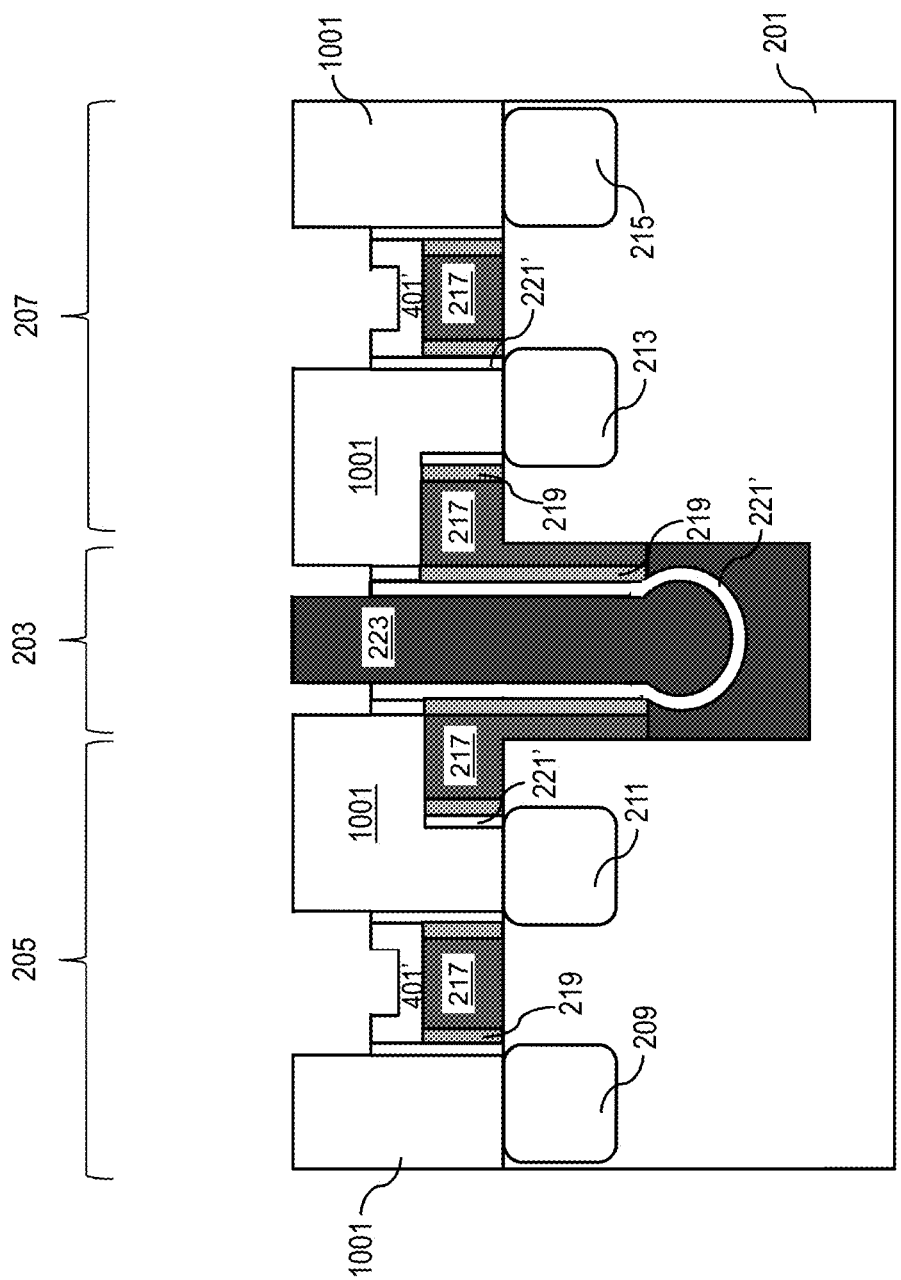
Figure 12:
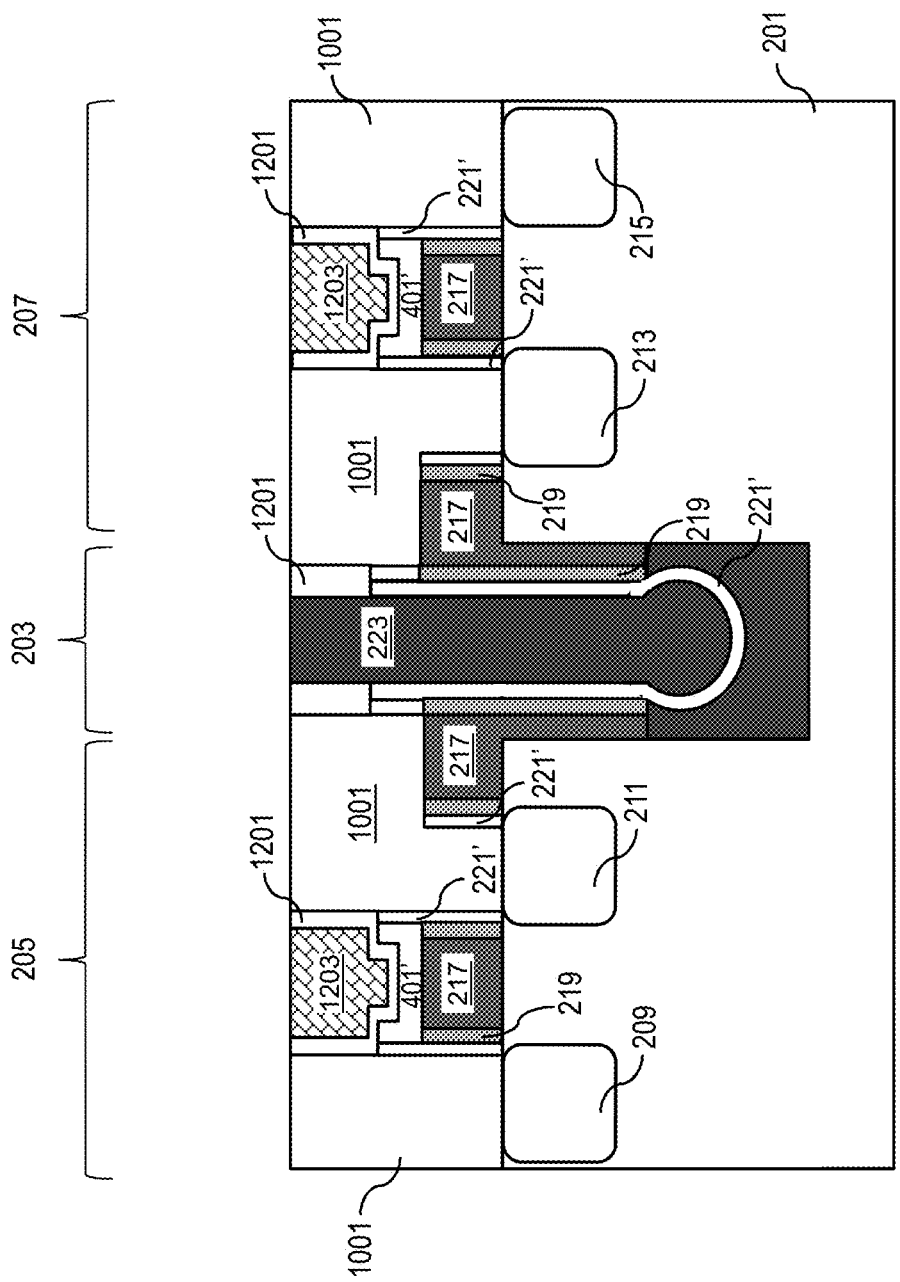

Referring to FIG. 10, a W layer (not shown for illustrative convenience) is formed over the substrate 201 and then planarized down to the a-Si layer 701 by CMP, forming the W layer 1001. Next, the a-Si layer 701 is removed, e.g., by RIE, as depicted in FIG. 11. An oxide liner 1201 is formed, e.g., to a thickness of 4 nm to 5 nm, over the nitride liner 221', the U-shaped nitride liner 401' and along the sidewalls of the W layer 1001, and then planarized, e.g., by CMP, sown to the W layer 1001, as illustrated in FIG. 12. Thereafter, an oxide layer (not shown for illustrative convenience) is formed over the substrate 201 and planarized, e.g., by CMP, down to the W layer 1001, forming the oxide layer 1203, which consequently has a thickness, e.g., of 15 nm to 25 nm.

The embodiments of the present disclosure can achieve several technical effects including preventing cap material and spacer erosion during subsequent TS and CEL RIE, reducing step height to improve WID uniformity and prevent TS to PC short, and reducing the gate height budget and thereby reducing and/or eliminating the issues of PC collapse, hugging gates and Rx hole and CT tip to tip shorts. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated finFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
a first pair of gates and a second pair of gates over a substrate with a shallow trench isolation (STI) structure between a first region and a second region of the substrate;
a first nitride liner along and above sidewalls of the first pair of gate structures and sidewalls of the second pair of gates adjacent to the STI structure and along opposite sidewalls of the second pair of gates;
a U-shaped nitride liner over each of the first pair of gate structures;
a second nitride liner along the first nitride liner above sidewalls of the second pair of gates;
a bilayer self-aligned contact (SAC) cap over the U-shaped nitride liner and the first nitride liner along and above sidewalls of each of the first pair of gates;
an oxide structure over the first nitride liner and the second nitride liner adjacent to the STI structure; and
tungsten (W) over portions of the substrate and each of the second pair of gates,
wherein an upper surface of each of the W, the bilayer SAC caps, the oxide structures, and the STI structure is coplanar.

2. The device according to claim 1, wherein each gate of the first pair and the second pair comprises:
a metal gate; and
a low-K spacer along each sidewall of the metal gate.

3. The device according to claim 1, wherein the substrate comprises:
a silicon (Si) layer with a first region and a second region each on opposite sides of the STI structure; and source/drain (S/D) regions laterally separated in the first region and S/D regions laterally separated in the second region.

4. The device according to claim 3, wherein the first pair of gates are formed between the S/D regions in the first region and the S/D regions in the second region, respectively, and the second pair of gates are formed adjacent to a S/D region in the first region, along a portion of a sidewall of the substrate in the first region and adjacent to the STI structure and adjacent to a S/D region in the second region, along a portion of a sidewall of the substrate in the second region and adjacent to the STI structure, respectively.

5. The device according to claim 3, wherein the first region and the second region comprise a negative region and a positive region, respectively.

6. The device according to claim 3, wherein the S/D regions in the first region and the S/D regions in the second region comprise silicon germanium (SiGe) or any epitaxial (EPI) material and a silicon-phosphorus (SiP) or any EPI material layer, respectively.

7. The device according to claim 1, wherein the bilayer SAC cap comprises:
 a U-shaped oxide liner over the first nitride liner and the U-shaped nitride liner; and
 an oxide layer within the U-shaped oxide liner,
 wherein an upper surface of the U-shaped oxide liner and an upper surface of the oxide layer are coplanar.

\* \* \* \* \*